(12) United States Patent
Gilbert et al.

(10) Patent No.: US 8,998,622 B2
(45) Date of Patent: Apr. 7, 2015

(54) ELECTRICAL CONNECTORS WITH APPLICATORS FOR ELECTRONIC DEVICES

(75) Inventors: Taylor H. Gilbert, Sunnyvale, CA (US); Sean S. Corbin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 91 days.

(21) Appl. No.: 13/601,884

(22) Filed: Aug. 31, 2012

(65) Prior Publication Data

US 2014/0065851 A1 Mar. 6, 2014

(51) Int. Cl.
| | | |
|---|---|---|
| H01R 12/00 | (2006.01) | |
| H05K 1/00 | (2006.01) | |
| H01R 12/52 | (2011.01) | |
| H01R 4/04 | (2006.01) | |
| H01R 43/26 | (2006.01) | |
| H05K 3/36 | (2006.01) | |
| H01R 12/62 | (2011.01) | |

(52) U.S. Cl.
CPC .................. *H01R 12/52* (2013.01); *H05K 1/00* (2013.01); *H01R 12/00* (2013.01); *H01R 4/04* (2013.01); *H01R 12/62* (2013.01); *H01R 43/26* (2013.01); *H05K 3/361* (2013.01); *H05K 2201/0281* (2013.01); *H05K 2201/0355* (2013.01); *H05K 2201/1028* (2013.01); *H05K 2201/1034* (2013.01)

(58) Field of Classification Search
USPC ............................. 439/67, 62, 492, 493, 496; 361/748–750, 784; 29/829, 830, 842, 29/874, 876, 426.4; 174/254; 157/379.7, 157/379.8, 931, 930
See application file for complete search history.

(56) References Cited

U.S. PATENT DOCUMENTS

| | | | | |
|---|---|---|---|---|
| 3,221,286 | A | * | 11/1965 | Feede .............................. 439/67 |
| 5,044,980 | A | * | 9/1991 | Krumme et al. ............... 439/496 |
| 5,403,202 | A | * | 4/1995 | Roehling ....................... 439/493 |
| 5,505,625 | A | * | 4/1996 | Byer et al. ....................... 439/62 |
| 6,358,064 | B2 | * | 3/2002 | Szalay et al. .................... 439/67 |
| 7,628,641 | B2 | | 12/2009 | Cheng |
| 8,156,641 | B2 | | 4/2012 | Massopust et al. |
| 2011/0269319 | A1 | * | 11/2011 | Cheng ............................. 439/67 |
| 2012/0153493 | A1 | | 6/2012 | Lee et al. |
| 2012/0238045 | A1 | | 9/2012 | Roberts |

FOREIGN PATENT DOCUMENTS

| | | |
|---|---|---|
| EP | 2509400 | 10/2012 |
| WO | 2011099851 | 8/2011 |

* cited by examiner

*Primary Examiner* — Abdullah Riyami
*Assistant Examiner* — Harshad Patel
(74) *Attorney, Agent, or Firm* — Treyz Law Group; Kendall P. Woodruff

(57) ABSTRACT

Electronic devices may be provided with electronic components and electrical connectors coupled between the electronic components. A connector may be formed in a small gap between the electronic components. The connector may be a thin sheet of flexible conductive material with a conductive adhesive on one surface. The connector may be installed between the components using an applicator that is attached to the connector. The applicator may be a pull-tab liner having a first surface that is tacky and a second opposing surface that is non-stick. The applicator may have an extended portion that can be held by a technician while installing the connector. The connector may be installed by inserting the connector and applicator between the components, pinching the components against the connector and applicator, and removing the applicator by pulling the extended portion to peel the applicator from the connector.

23 Claims, 8 Drawing Sheets

ELECTRICAL CONNECTORS WITH APPLICATORS FOR ELECTRONIC DEVICES

BACKGROUND

This relates generally to electrical connectors, and more particularly, to connectors with applicators for installation in electronic devices such as portable electronic devices.

Handheld electronic devices and other portable electronic devices are becoming increasingly popular. Examples of handheld devices include handheld computers, tablet computers, media players, and cellular telephones.

Portable electronic devices may contain complex electronic circuitry in a compact area. Electronic components such as printed circuit boards, flexible printed circuits, integrated circuits, displays, and other electronic components are often connected together using rigid electrical connecting material such as solder that also mechanically couples the components together.

However, in some situations it is desirable to electrically connect electronic components without mechanically constraining the components together. Flexible printed circuits are sometimes used to electrically connect one or more components while allowing mechanical mobility between the components. However, providing space in a device for a flexible printed circuit between closely mounted components can force a designer to make undesired compromises when constructing an electronic device.

It would therefore be desirable to be able to provide improved connectors for compact electronic devices.

SUMMARY

Electronic devices may be provided with electronic components and electrical connectors. An electrical connector may be a thin sheet of flexible conductive material. The thin sheet of flexible conductive material may include an adhesive surface and an opposing surface that is free of adhesive material. The adhesive surface may be attached to first and second electronic components to electrically connect the first electronic component to the second electronic component.

The connector may be mounted in a small gap between the electronic components. During device assembly operations, the connector may be installed in the gap between the components using an applicator that is attached to the connector. The applicator may be a pull-tab release liner that is formed from one or more layers of a flexible material such as a flexible insulating material. Each layer of flexible material for the applicator may include a first adhesive surface that is tacky and a second opposing surface that is free of adhesive material.

The applicator may have an extended portion that can be held by a technician while installing the connector. The connector may be installed by inserting the connector and applicator between the first and second electronic components, pinching the first and second electronic components against the connector, and removing the applicator by pulling the extended portion to peel the applicator away from the connector.

Prior to installation in a device, the electrical connector may be provided with one or more protective liners such as release liners that are attached to portions of the adhesive surface of the electrical connector.

Further features of the invention, its nature and various advantages will be more apparent from the accompanying drawings and the following detailed description of the preferred embodiments.

DETAILED DESCRIPTION

Electronic device may be provided with electronic components such as displays, printed circuit boards, flexible printed circuits, integrated circuits, cameras, and buttons. An electronic component may be electrically coupled to one or more other electronic components using connectors that allow the connected components to move with respect to each other. By providing connectors that allow the connected components to move with respect to each other, one or more of the connected components can be mechanically coupled to another device component or device structure following attachment of the connector.

During assembly of the device, an applicator such as a liner that can be pulled away from the connector (e.g., a pull-tab liner that can be removed by a technician using a tool or fingers) may be used to position the connector between the electronic components to be connected. The applicator can then be pulled away from the connector leaving the connector attached to the electronic components.

Figure 1:
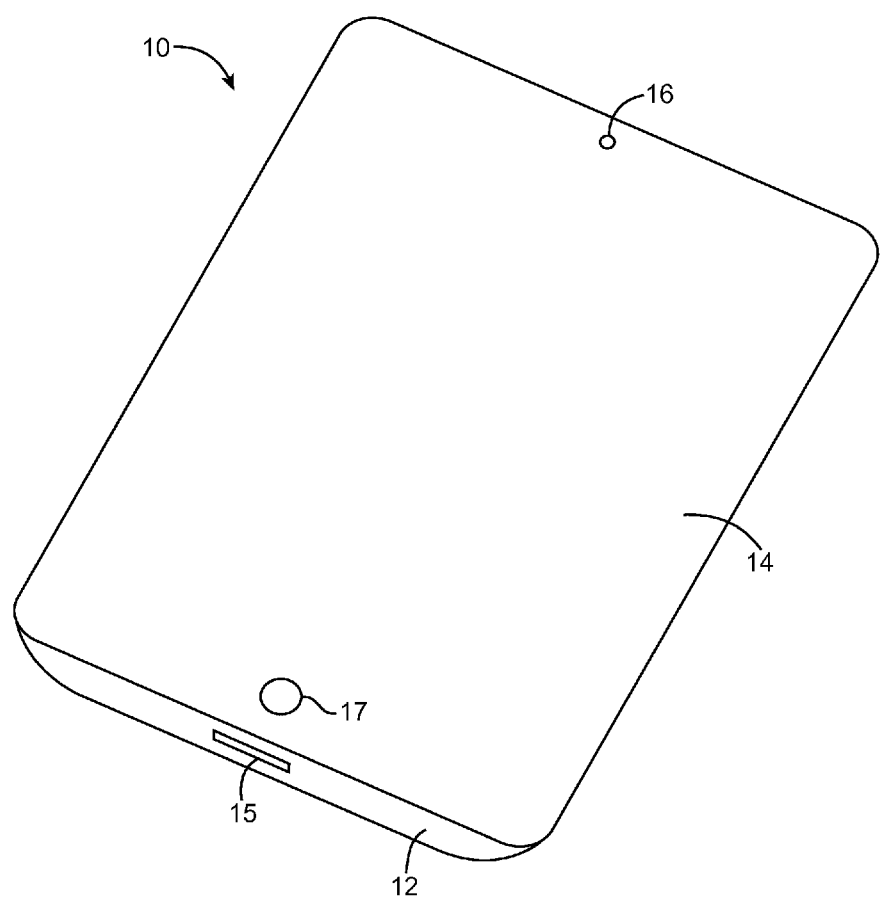
FIG. 1 is a perspective view of an illustrative electronic device with electronic components in accordance with an embodiment of the present invention.

An illustrative electronic device of the type that may be provided with one or more electrical connectors is shown in FIG. 1. Electronic device 10 may be a computer such as a tablet computer. Electronic device 10 may also be a laptop computer, a computer that is integrated into a display such as a computer monitor, a somewhat smaller portable device such as a wrist-watch device, pendant device, headphone device, earpiece device, or other wearable or miniature device, a cellular telephone, a media player, or other electronic equipment. Illustrative configurations in which electronic device 10 is a tablet computer are sometimes described herein as an example. In general, electronic device 10 may be any suitable electronic equipment.

Device 10 may include internal electronic components that are electrically coupled together by connectors that allow the components to travel relative to each other when the connector is attached to the components.

Device 10 may include a display such as display 14. Display 14 may be mounted in a housing such as electronic device housing 12. If desired, housing 12 may be supported using a stand or other support structure. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Display 14 may be a touch screen that incorporates capacitive touch electrodes or other touch sensor components or may be a display that is not touch sensitive.

Display 14 may be provided with a cover layer having one or more openings. For example, a rigid cover layer may have openings such as an opening for button 17 and a speaker port opening for speaker 16 (e.g., for an ear speaker for a user). Device 10 may also have other openings in display 14 and/or openings in housing 12 such as opening 15 for a data port connector or openings for accommodating volume buttons, ringer buttons, sleep buttons, and other buttons, openings for an audio jack, removable media slots, etc.

Figure 2:
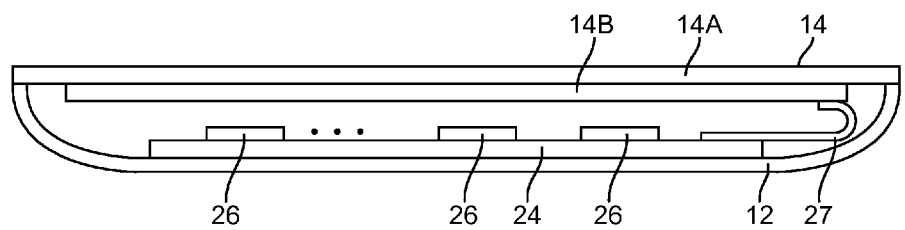
FIG. 2 is a cross-sectional side view of illustrative electronic device with electronic components in accordance with an embodiment of the present invention.

A cross-sectional side view of device 10 is shown in FIG. 2. As shown in FIG. 2, display 14 may include a transparent display cover layer such as display cover layer 14A. Display cover layer 14A may be formed from a clear glass layer, a transparent layer of plastic, or other transparent material. Display 14 may include display structures 14B. Display structures 14B may include an array of display pixels for displaying images for a user. Display cover layer 14A may be used to protect display structures 14B and, if desired, touch sensor structures in display 14. Display structures 14B may include display pixels formed from light-emitting diodes (LEDs), organic LEDs (OLEDs), plasma cells, electrophoretic display structures, electrowetting display structures, liquid crystal display (LCD) components, or other suitable display pixel structures.

Device 10 may include other internal electronic components such as printed circuit 24 (e.g., a rigid printed circuit board), components 26, flexible printed circuits such as flex circuit 27 and other electronic components. Components 26 may include display driver circuitry, processors, memory, communications circuitry such as wireless transceiver circuitry, and application-specific integrated circuits. Some components 26 may be attached to printed circuit board 24 using solder. Flexible printed circuit 24 may be used to transmit signals from printed circuit board 24 to display 14. A flexible printed circuit such as flexible printed circuit 24 may be attached to printed circuit board 24 and/or display 14 using solder, using anisotropic conductive adhesive, or using a flex circuit connector structure (as examples).

These types of rigid connections may be suitable for connecting device components that have fixed positions with respect to one another. However, during assembly of device 10, a component (e.g., one of components 26 or a flex circuit such as flex circuit 27) may be electrically coupled to another component (e.g., another component 26, another flexible printed circuit, etc.) before being mechanically attached to yet another component or structure (e.g., to printed circuit board 24, display 14, or housing 12). It can therefore be desirable to electrically connect electronic components using an electrical connector that allows some amount of mobility for the connected components. In this way, an electronic component that is electrically connected to another electronic component can be subsequently moved into position for connection or attachment to an additional structure or component.

Figure 3:
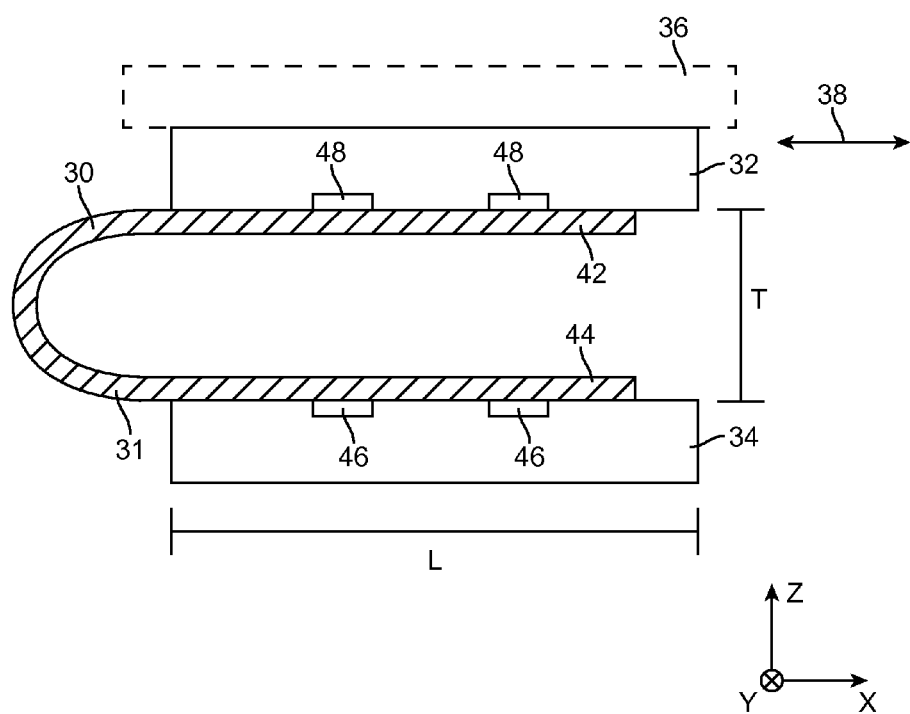
FIG. 3 is a cross-sectional side view of an illustrative electrical connector between electronic components that allows the electronic components to move in accordance with an embodiment of the present invention.

An example of an electrical connector that electrically couples one electronic component to another electronic component without mechanically coupling the electronic components is shown in FIG. 3. As shown in FIG. 3, connector 30 may be used to electrically couple electronic component 32 to electronic component 34.

Electrical (electronic) component 32 may be a flexible printed circuit, a rigid printed circuit, an integrated circuit, an operational component (e.g., a button, a battery, a camera, etc.) or other electronic circuitry. Component 32 may include electrical contacts such as contact pads 48 that are electrically connected to connector 30.

Electrical (electronic) component 34 may be a flexible printed circuit, a rigid printed circuit, an integrated circuit, an operational component (e.g., a button, a battery, a camera) or other electronic circuitry. Component 34 may include electrical contacts such as contact pads 46 that are electrically connected to connector 30. Connector 30 may be used to route signals or, voltages, currents or other electrical communication between contacts 46 and contacts 48. In one suitable configuration that is sometimes discussed herein as an example, components 32 and 34 may each be a separate flexible printed circuit with exposed contact pads (e.g., exposed portions of a conductive layer such as a patterned copper layer within the flexible printed circuit).

Connector 30 may be formed from any suitable conductive material (e.g., a sheet of copper, aluminum, or other metal, a conductive fabric, or other thin conductive material). Connector 30 may include a layer of conductive adhesive material on outer surface 31 that attaches portion 42 of connector 30 to contacts 48 and portion 44 of connector 30 to contacts 46.

As shown in FIG. 3, component 32 may be attached to another member 36. Member 36 may be another electronic component such as display 14 or may be a structural member such as housing 12 or an internal support structure. Component 32 may be attached to member 36 using adhesive, using mechanical attachment members (e.g., screws, clips or other fasteners), using an electrical connector, or other attachment structures.

During assembly of device 10, connector 30 may be attached to components 32 and 34 before connecting component 32 to optional member 36. It may therefore be desirable to be able to move component 32, for example, in the x-y plane of FIG. 3 as indicated by arrows 38 into an appropriate position for attaching component 32 to member 36. Connector 30 may therefore be formed from a flexible conductive material that allows component 32 to move a distance in the x-y plane of between 0.5 mm and 1 mm, 0.2 mm and 0.8 mm, 0.6 mm and 1.5 mm, more than 0.1 mm, or less than 3 mm (as examples) with respect to component 34.

Components 32 and/or 34 may each have a length such as length L that is between 5 mm and 7 mm, between 3 mm and 9 mm, between 3 mm and 5 mm, between 6 mm and 8 mm, less than 10 mm or more than 1 mm (as examples). Components 32 and 34 may be separated by a gap having a thickness T that is between 0.2 mm and 0.4 mm, between 0.25 mm and 0.35 mm, between 0.1 mm and 0.3 mm, between 0.05 mm and 0.4 mm, greater than 0.05 mm, or less than 5 mm (as examples).

Figure 4:
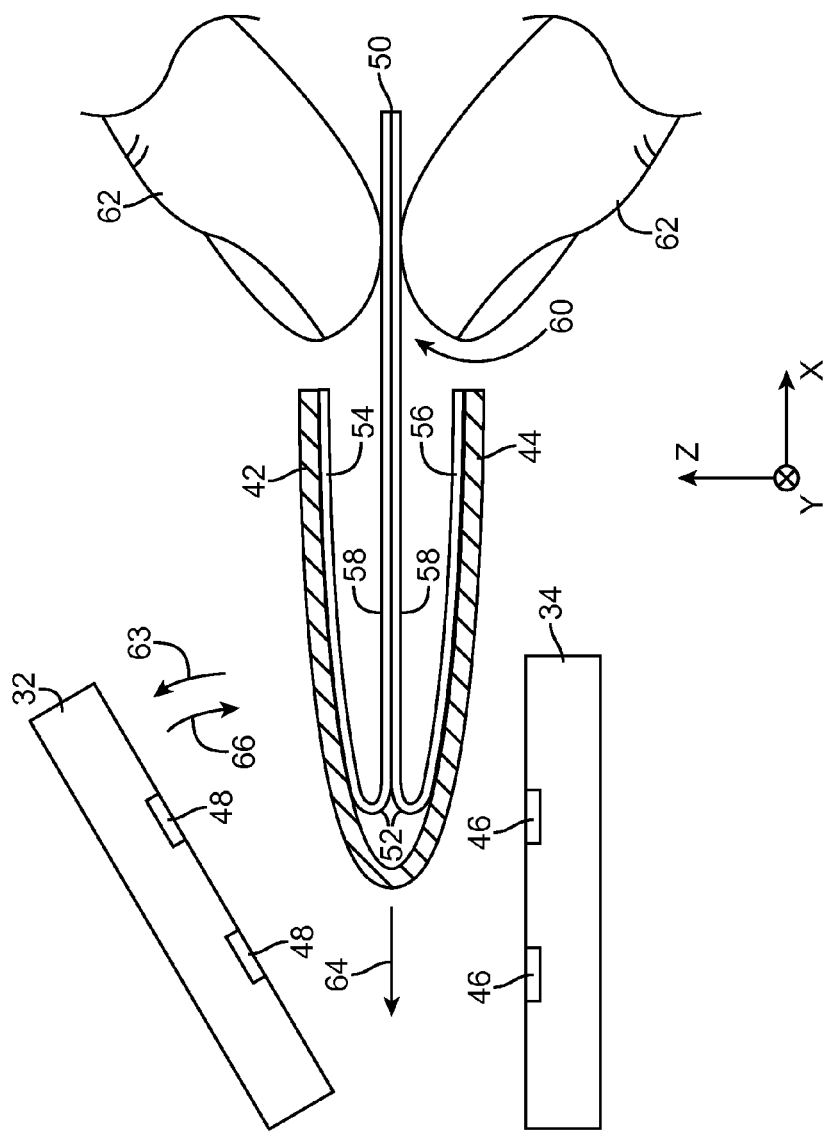
FIG. 4 is a cross-sectional side view of the illustrative electrical connector of FIG. 3 during assembly of an electronic device showing how a pull-tab liner may be used to install the connector between the electronic components in accordance with an embodiment of the present invention.

Because thickness T of the gap between components 32 and 34 is small (e.g., substantially smaller than a human finger), connector 30 may be provided with an applicator for installing connector 30 between components 32 and 34 as shown in FIG. 4. As shown in FIG. 4, applicator 50 may be configured as a pull-tab liner for connector 30. Applicator 50 may be formed from a flexible material such as polyethylene terephthalate that is tacky (sticky) on inner surface 52 and non-stick on outer surface 58. In this way, tacky inner surface 52 may be self-adhered in extended portion 60 and may be attached to portion 42 of conductive connector 30 in region 54 and attached to portion 44 of connector 30 in region 56.

Figure 5:
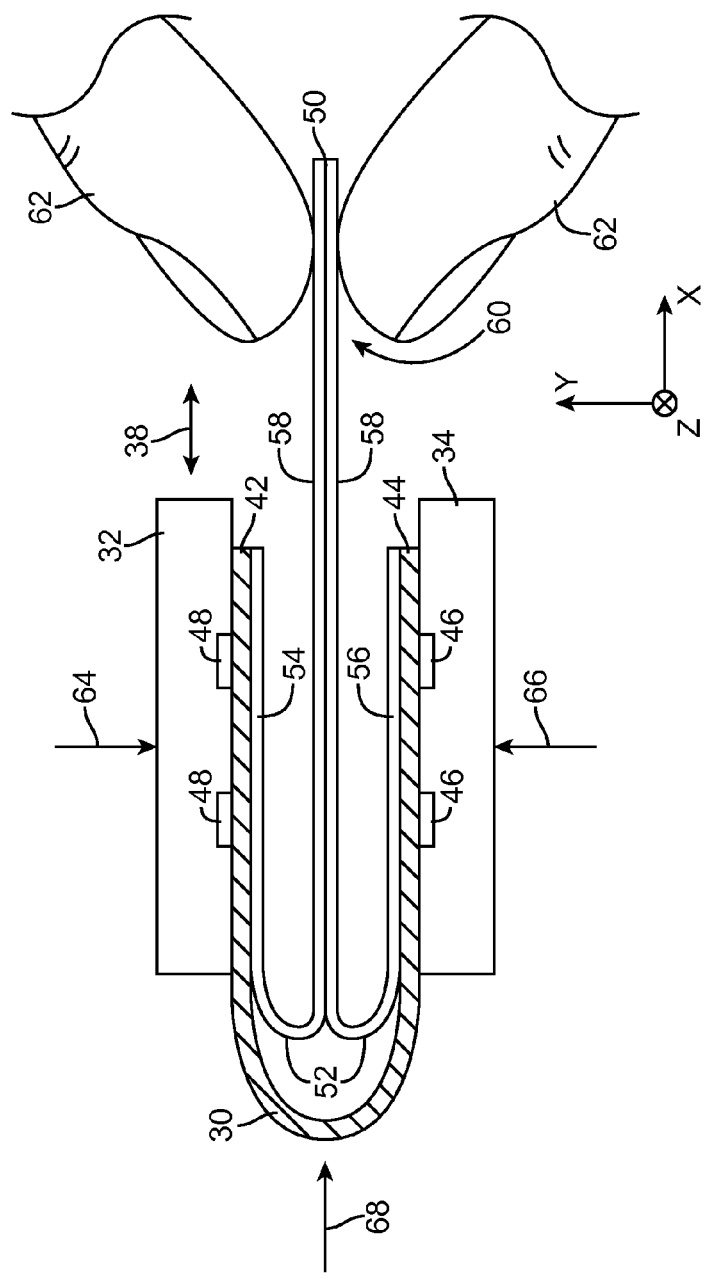
FIG. 5 is a cross-sectional side view of the illustrative electrical connector of FIG. 4 during a later stage of assembly of the electronic device showing how the electronic components may be compressed against the connector and the pull-tab liner in accordance with an embodiment of the present invention.

During device assembly operations, a technician may hold extended portion 60 (e.g., using fingers 62 or a tool such as tweezers or pliers). The technician may lift component 32 in direction 63 (e.g., turning one edge of component 32 to an angle of up to 45 degrees) and move connector 30 between components 32 and 34 in direction 64 using applicator 50. While connector 30 and applicator 50 are between components 32 and 34, the technician may move component 32 in direction 66 until connector 30 and applicator 50 are compressed between components 32 and 34 as shown in FIG. 5.

While connector 30 and applicator 50 are compressed between components 32 and 34, the technician may exert a force in direction 64 on component 32 and an opposing force in direction 66 on component 34 (e.g., by pinching component 32 against component 34 using fingers or another tool) so that portion 42 of connector 30 attaches to contacts 48 of component 30 and portion 44 of connector 30 attaches to contacts 46 of component 34. While exerting forces in directions 64 and 66 that hold connector 30 between components 32 and 34, the technician may pull portion 60 of applicator 50 in direction 68 so that portion 54 and portion 56 of applicator 50 peel away from respective portions 42 and 44 of connector 30 leaving connector 30 coupled between components 32 and 34.

Figure 6:
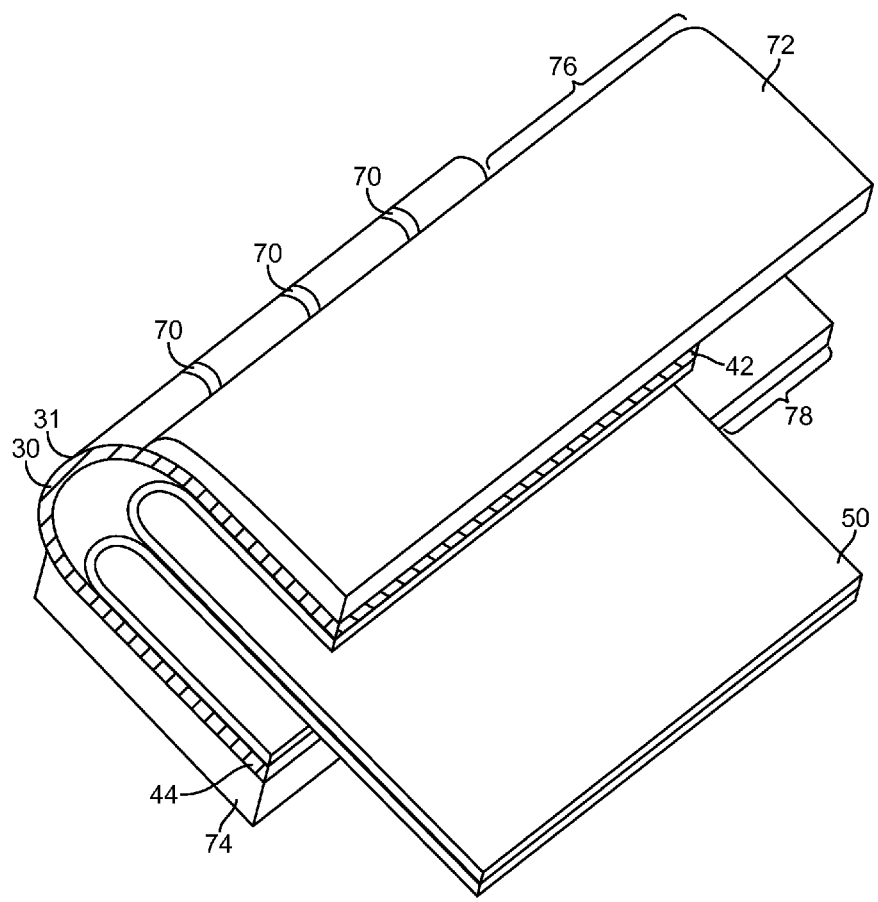
FIG. 6 is a perspective view of an illustrative electrical connector having a pull-tab liner and outer release liners in accordance with an embodiment of the present invention.

As shown in the perspective view of connector 30 of FIG. 6, prior to installation in device 10, connector 30 may be provided with one or more release liners that cover adhesive portions of connector 30. In the example of FIG. 6, a first release liner 72 may be attached to portion 42 of connector 30 and a second release liner 74 may be attached to portion 44 of connector 30. Liners 72 and 74 may be formed from plastic, polyethylene terephthalate, or other suitable flexible materials that can be temporarily attached to an adhesive surface of connector 30.

Liners 72 and 74 may have respective extended portions 76 and 78 that extend beyond the edge of connector 30. Extended portions 76 and 78 may be used (e.g., gripped and pulled) by a technician to remove respective liners 72 and 74 from connector 30 prior to insertion of connector 30 between components 32 and 34 (as described above in connection with FIG. 4). The example of FIG. 6 in which connector 30 is provided with two release liners is merely illustrative. If desired, connector 30 may be provided with more than two release liners or may be provided with a single release liner that covers substantially all of surface 31 of connector 30.

As shown in FIG. 6, connector 30 may be provided with openings such as slots 70. Slots 70 may provide connector 30 with additional flexibility that provides components 32 and/or 34 with one or more additional degrees of freedom of motion when attached to connector 30. These additional degrees of freedom of motion may help when positioning a component such as component 32 for connection to an additional member such as member 36 of FIG. 3.

Figure 7:
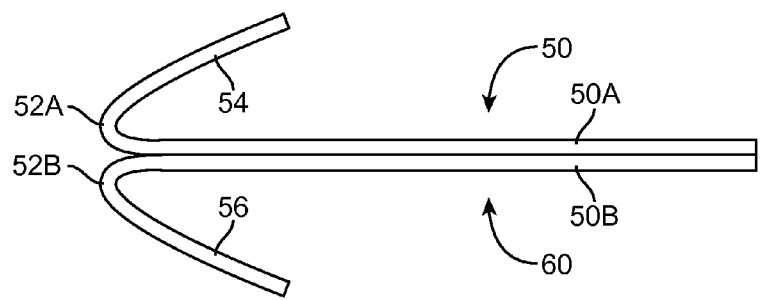
FIG. 7 is a side view of an illustrative pull-tab liner that is formed from multiple layers of flexible material in accordance with an embodiment of the present invention.

As shown in FIG. 7, applicator 50 may be formed from two separate sheets of flexible material (layers 50A and 50B) such as insulating material each of which has one adhesive (tacky) surface and an opposing surface that is non-stick (i.e., free of adhesive material). In the example of FIG. 7, portion 54 and portion 56 of applicator 50 are end portions of respective first flexible layer 50A and second flexible layer 50B. Layer 50A may be attached to layer 50B by attaching tacky inner surface 52A of layer 50A to tacky inner surface 52B of layer 50B in extended portion 60 while leaving end portions 54 and 56 free for attachment to connector 30. However, the configuration of applicator 50 shown in FIG. 7 is merely illustrative. If desired, applicator 50 may be formed from a single folded sheet of flexible material (e.g., flexible insulating material such as plastic) that is tacky on one surface and non-stick on an opposing second surface as shown in FIG. 8.

Figure 8:
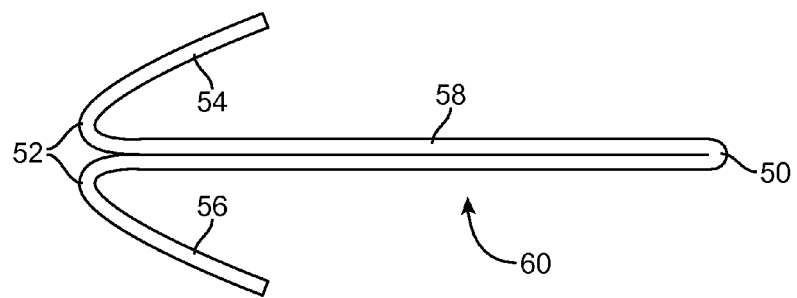
FIG. 8 is a side view of an illustrative pull-tab liner that is formed from a single folded layer of flexible material in accordance with an embodiment of the present invention.

In the example of FIG. 8, surface 52 of applicator 50 is an adhesive (e.g., tacky or sticky) surface while opposing surface 58 is non-stick (i.e., free of adhesive material). A portion of tacky inner surface 52 is folded onto itself to form extended portion 60 of applicator 50 while surface 52 in portions 54 and 56 is left free for attachment to connector 30. Portions 54 and 56 of applicator 50 that attach to connector 30 may be formed from end portions of the folded sheet of flexible material.

Figure 9:
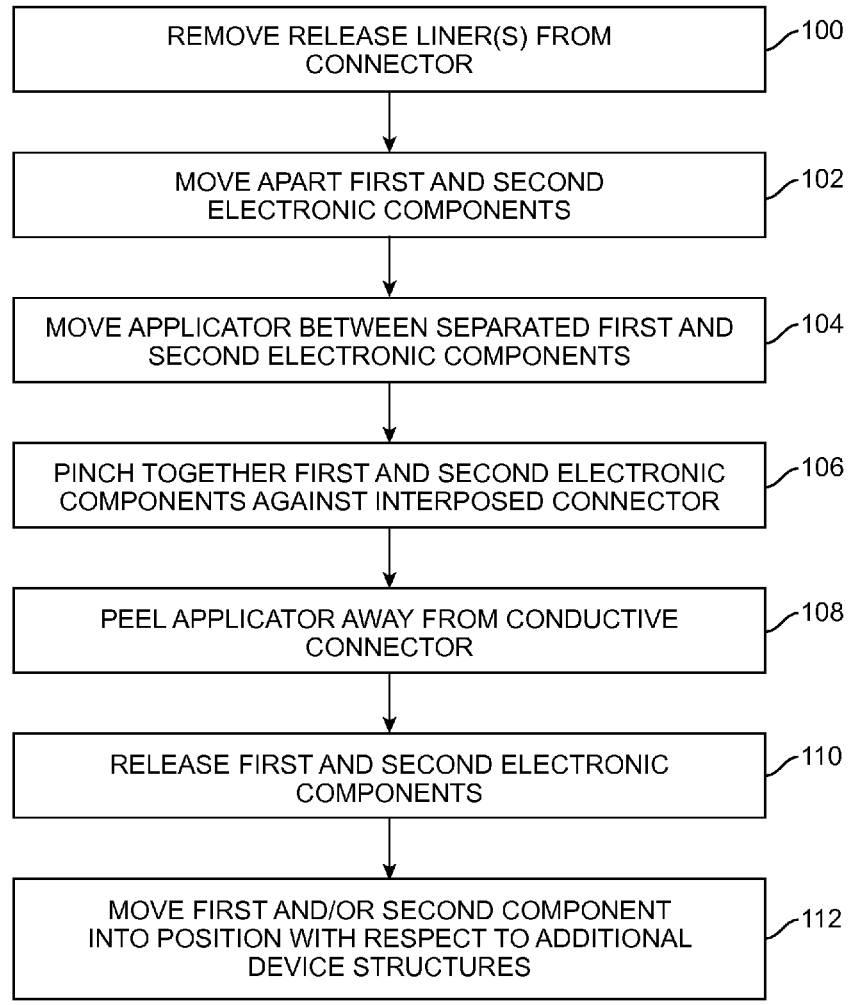
FIG. 9 is a flow chart of illustrative steps involved in attaching a flexible conductive connector in a small gap between electronic components using a pull-tab liner in accordance with an embodiment of the present invention.

Illustrative steps that may be used in attaching a connector such as connector 30 to components such as components 32 and 34 are shown in FIG. 9.

At step 100, one or more protective liners such as release liners 72 and 74 of FIG. 6 may be removed from a connector such as connector 30 of (for example) FIGS. 3, 4, 5, and 6. Removing the protective liners may include peeling the liners away from connector 30 using tools such as tweezers, automated tools, or a technician may remove the liners by hand.

At step 102, a first electronic component may be moved away from a second electronic component as described above in connection with FIG. 4. The first component may be rotated and/or lifted (e.g., by a technician or automatic assembly equipment) in order to increase the size of a gap between the components into which a connector such as connector 30 can be inserted using an applicator such as pull-tab release liner 50.

At step 104, while the first electronic component is held at an angle with respect to the second electronic component, the applicator (e.g., applicator 50 attached to connector 30) may be moved into a position that is between the first electronic component and the second electronic component.

At step 106, while the connector and applicator are positioned between the first and second electronic components, the connector may be attached to the first and second electronic components by pinching the first and second components together against the connector. Pinching the first and second electronic components may include exerting a force against the first electronic component and an opposing force against the second electronic component while the connector and applicator are positioned between the components.

At step 108, while pinching the first and second electronic components together, a technician (or automated assembly equipment) may remove applicator (e.g., liner 50) from the connector by pulling the applicator from between the first and second electronic components to peel the applicator away from the connector.

At step 110, the first and second electronic components may be released (un-pinched) so that the first and second electronic components are connected to the connector and free to move a small distance (e.g., 0.5 mm to 1 mm) with respect to each other.

At step 112, if desired, while connected to the connector, the first electronic component and/or the second electronic component may be moved into a position with respect to one or more additional device structures (e.g., another electronic component or a device support structure). Moving one of the electronic components into this type of position may allow that electronic component to be attached to the additional device structure.

The foregoing is merely illustrative of the principles of this invention and various modifications can be made by those skilled in the art without departing from the scope and spirit of the invention.

What is claimed is:

1. An electrical connector for electrically coupling electronic components in an electronic device, comprising:
    a sheet of conductive material having an adhesive surface and an opposing surface; and
    an applicator attached to the sheet of conductive material, wherein the applicator has first and second portions that are attached to the opposing surface of the sheet of conductive material, wherein the applicator has an extended portion, and wherein the first and second portions of the applicator are configured to peel away from the sheet of conductive material when a pulling force is exerted on the extended portion.

2. The electrical connector defined in claim 1 wherein the applicator comprises first and second layers of flexible material.

3. The electrical connector defined in claim 2 wherein the first and second layers of flexible material each have an adhesive surface and an opposing surface that is free of adhesive material.

4. The electrical connector defined in claim 3 wherein the adhesive surface of the first layer of flexible material is attached to the adhesive surface of the second layer of flexible material in the extended portion of the applicator.

5. The electrical connector defined in claim 3 wherein the first portion of the applicator comprises a portion of the first layer of flexible material that is attached to the opposing surface of the sheet of conductive material.

6. The electrical connector defined in claim 5 wherein the second portion of the applicator comprises a portion of the second layer of flexible material that is attached to the opposing surface of the sheet of conductive material.

7. The electrical connector defined in claim 1 wherein the applicator comprises a folded sheet of flexible material having an adhesive surface and an opposing surface that is free of adhesive material.

8. The electrical connector defined in claim 7 wherein a first portion of the adhesive surface of the folded sheet of flexible material is folded onto a second portion of the adhesive surface of the folded sheet of flexible material in the extended portion.

9. The electrical connector defined in claim 7 wherein the first and second portions of the applicator that are attached to the opposing surface of the sheet of conductive material comprise first and second end portions of the sheet of flexible material.

10. The electrical connector defined in claim 9, further comprising first and second protective liners attached to the adhesive surface of the sheet of conductive material.

11. The electrical connector defined in claim 10 wherein the first and second protective liners each comprise an extended portion that extends beyond an edge of the adhesive surface of the sheet of conductive material.

12. The electrical connector defined in claim 1, wherein the sheet of conductive material comprises at least one opening that allows the sheet of conductive material to be flexed.

13. A method of attaching an electrical connector to first and second electronic components in an electronic device, wherein the electrical connector has an attached applicator with an extended portion, the method comprising:
    inserting the electrical connector and a portion of the attached applicator into a gap between the first and second electronic components;
    attaching the electrical connector to the first and second electronic components by pinching the first and second electronic components against a common surface of the electrical connector; and
    while pinching the first and second electronic components against the common surface of the electrical connector, removing the attached applicator from the electrical connector by pulling the extended portion of the attached applicator.

14. The method defined in claim 13, further comprising:
    releasing the first and second electronic components that have the electrical connector attached.

15. The method defined in claim 13, further comprising:
    before inserting the electrical connector and the portion of the attached applicator into a gap between the first and second electronic components, increasing the size of the gap by moving the first electronic component away from the second electronic component.

16. The method defined in claim 13, further comprising:
    before inserting the electrical connector and the portion of the attached applicator into the gap between the first and second electronic components, removing at least one protective liner from the common surface of the electrical connector.

17. The method defined in claim 13, further comprising:
    attaching the first electronic component to an additional device structure.

18. The method defined in claim 17 wherein attaching the first electronic component to the additional device structure comprises moving the first electronic component with respect to the second electronic component while the electrical connector is attached to the first and second electronic components.

19. An electronic device, comprising:
    a first electronic component having a surface;
    a second electronic component having a surface that opposes the surface of the first electronic component; and
    an electrical connector comprising a flexible sheet of metal, wherein the flexible sheet of metal is formed entirely of metal and has first and second opposing surfaces, wherein the first surface of the flexible sheet of metal is adhered to the surface of the first electronic component and the opposing surface of the second electronic component, wherein the second surface of the flexible sheet of metal is exposed to air, wherein the flexible sheet of metal includes a first planar portion and a second planar portion and is bent into a U-shape such that the first planar portion overlaps the second planar portion, wherein the electrical connector is mounted in a gap between the first and second electronic components and wherein the gap has a thickness that is less than 1 millimeter.

20. The electronic device defined in claim 19 wherein the first electronic component comprises a first flexible printed circuit and wherein the second electronic component comprises a second flexible printed circuit.

21. The electronic device defined in claim 20, further comprising an additional member attached to the first electronic component, wherein the first electronic component is mechanically constrained by the attachment to the additional member.

22. The electronic device defined in claim 19 wherein the flexible sheet of metal comprises a curved portion where the flexible sheet of metal is bent and wherein the flexible sheet of metal comprises at least one opening in the curved portion.

23. The electronic device defined in claim 19 further comprising a conductive adhesive that adheres the surface of the electrical connector to the surface of the first electronic component.

* * * * *